(12) United States Patent
Rumney

(10) Patent No.: US 6,424,932 B1
(45) Date of Patent: Jul. 23, 2002

(54) METHODS AND APPARATUS FOR MEASURING SPECTRAL ENERGY

(75) Inventor: Moray Denham Rumney, Edinburgh (GB)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/349,548

(22) Filed: Jul. 8, 1999

(30) Foreign Application Priority Data

Jul. 31, 1998 (EP) .............................. 98306156

(51) Int. Cl.[7] .............................................. G10L 17/28
(52) U.S. Cl. .................... 702/199; 702/76; 702/189; 702/190; 702/194
(58) Field of Search .................. 704/230; 324/628, 324/76.38; 375/130, 10; 379/409; 702/76, 77, 199, 189, 190, 194; 364/576, 485; 455/424

(56) References Cited

U.S. PATENT DOCUMENTS

| | | | | |
|---|---|---|---|---|
| 3,733,555 A | * | 5/1973 | Marshall et al. ............. 328/14 |
| 4,642,778 A | * | 2/1987 | Hieftje et al. ................ 364/498 |
| 5,001,724 A | * | 3/1991 | Birgenbeier et al. .......... 375/10 |
| 5,117,441 A | * | 5/1992 | Weigand ....................... 375/90 |
| 5,187,719 A | * | 2/1993 | Birgenheier et al. .......... 375/10 |
| 5,251,233 A | * | 10/1993 | Labedz et al. ................ 375/12 |
| 5,545,976 A | * | 8/1996 | Cutler ....................... 324/76.38 |
| 5,694,414 A | * | 12/1997 | Smith et al. ................. 375/200 |
| 5,706,202 A | | 1/1998 | Itahara et al. ................ 364/485 |
| 5,732,328 A | | 3/1998 | Mitra et al. ................... 455/69 |
| 6,029,058 A | * | 2/2000 | Namgoong et al. .......... 455/324 |
| 6,044,111 A | * | 3/2000 | Meyer et al. ................ 375/231 |
| 6,069,913 A | * | 5/2000 | Suominen .................... 375/147 |

OTHER PUBLICATIONS

"Handy–Test an der Ladentheke" Funkschau, Franzis–Verlag K.G., vol. 68, No. 18, pp. 60–62, Aug. 16, 1996.

* cited by examiner

Primary Examiner—Marc S. Hoff
Assistant Examiner—Felix Suarez

(57) ABSTRACT

The spectral energy in the signal emitted by a mobile telephone handset is measured for portions of the signal carrying random data, both before and after a non-random midamble. By including both random portions in the measurement the time taken to perform it is approximately halved, whilst maintaining its statistical significance.

9 Claims, 3 Drawing Sheets

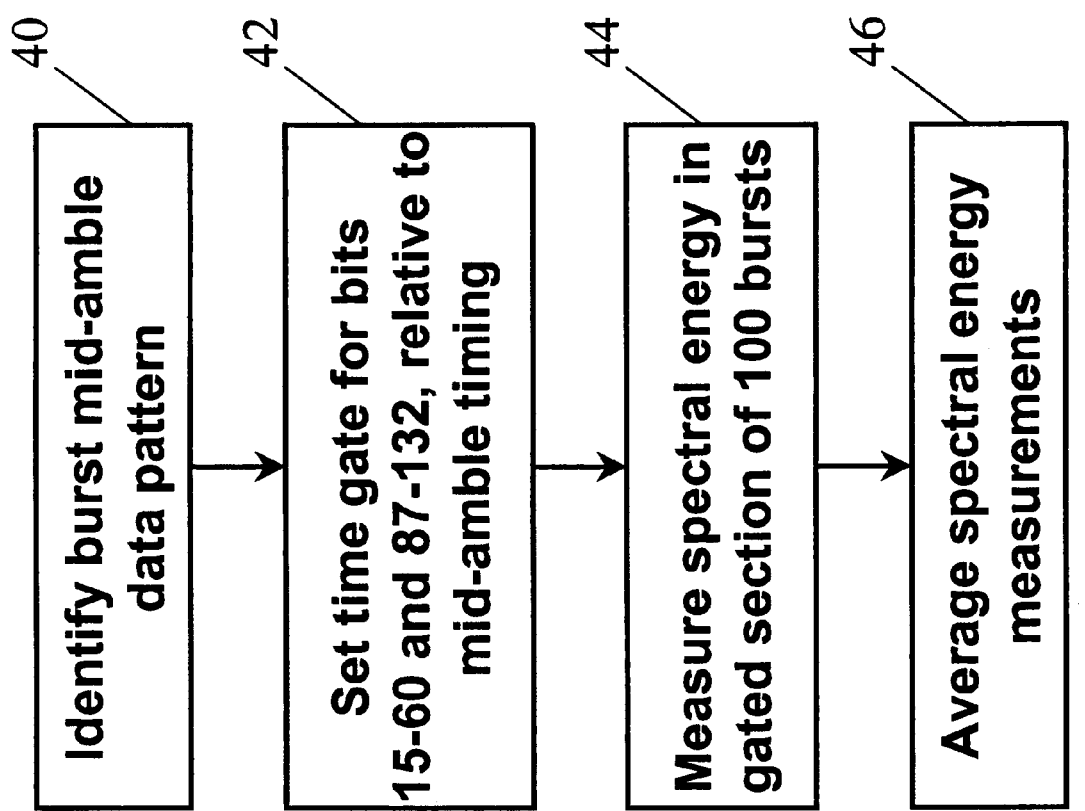

METHODS AND APPARATUS FOR MEASURING SPECTRAL ENERGY

TECHNICAL FIELD

This invention relates to methods and apparatus for measuring the spectral energy in the spectrum of a signal, such as a radio-frequency (r.f.), intermediate frequency (i.f.) or baseband signal, in particular in the case where the signal contains intervals of random modulation to be included in the measurement and an interval of non-random modulation to be omitted from the measurement.

BACKGROUND ART

The rapidly increasing adoption of mobile communications facilities, such as cellular telephone systems, has led to a huge and growing demand for the associated user devices, such as mobile telephone handsets and other mobile stations (MS). Because these devices are typically radio transmitters as well as receivers, it is essential that each device is fully tested by the manufacturer before shipment, to ensure that no undesirable radio emissions are generated which might cause interference to other users. Equally however, the manufacturers desire that these tests should be accomplished as quickly as possible, to minimise delays they introduce into production timescales.

In the case of the GSM system, for example, the relevant European Telecommunication Standards (GSM 05.05, 11.10, 11.20 and 11.21) provide for measurements of a variety of parameters, including the Output RF Spectrum (ORFS). Two ORFS measurements are defined, to ascertain the distribution of energy in the spectrum of the output RF signal of a GSM transmitter (mobile or fixed). The first measures effects of the modulation process and the second measures effects of switching transients. A GSM signal is normally burst modulated and this causes the switching transients. The measurement of ORFS due to modulation is intrinsically noisy in character, because the measurement bandwidth is defined to be significantly less than the modulation bandwidth, so a measurement of a single signal burst has a very low statistical significance. Therefore measurements of multiple bursts must be averaged to provide a useful result.

Each burst incorporates a "midamble" which is modulated with a fixed data pattern to assist receiver operation. Inclusion of this midamble in the measurement of ORFS due to modulation would conflict with the underlying assumptions involved in averaging multiple measurements, so it is necessary to exclude the fixed or non-random midamble modulation from this measurement.

For these reasons the GSM standards require that, at a given frequency in the spectrum, an energy measurement is made of the interval of a burst extending from a point occurring after 50% of the burst has elapsed, and excluding the midamble, until 90% of the burst has elapsed; in practice this involves selecting at least forty bits in the range from bit 87 to bit 132 inclusive. This measurement is typically repeated for 200 such bursts and the resulting values are averaged. This process is repeated at multiple frequency offsets to complete the determination of ORFS due to modulation.

The measurement of 200 bursts at one frequency setting cannot be completed any faster than the bursts actually occur, irrespective of the speed of the measurement equipment. The GSM frame rate is 216 bursts per second, so a 200-burst measurement at one frequency unavoidably takes the best part of one second. The duration of this determination is a significant contribution to the overall duration of the measurements required for complete testing of each MS during manufacture.

It is an object of this invention to reduce the duration of the measurement of the ORFS due to modulation while maintaining the statistical significance of the measurement results.

DISCLOSURE OF INVENTION

According to one aspect of this invention there is provided a method of measuring the spectral energy within a measurement bandwidth in the spectrum of a modulated signal which has a modulation bandwidth exceeding said measurement bandwidth and which contains at least two intervals of random modulation to be included in the measurement and an interval of non-random modulation to be omitted from the measurement, comprising the steps of:

receiving a signal containing the intervals of random and non-random modulation;

identifying the interval of non-random modulation in the signal;

identifying a first interval of random modulation in the signal in predetermined relationship with the interval of non-random modulation;

identifying a second interval of random modulation in the signal in predetermined relationship with the interval of non-random modulation;

selectively measuring the energy content of the first and second intervals of random modulation, while excluding the interval of non-random modulation; and averaging the results of those selective measurements.

According to another aspect of this invention there is provided apparatus for measuring the spectral energy within a measurement bandwidth in the spectrum of a modulated signal which has a modulation bandwidth exceeding said measurement bandwidth and which contains at least two intervals of random modulation to be included in the measurement and an interval of non-random modulation to be omitted from the measurement, comprising:

a receiver for receiving a signal containing the intervals of random and non-random modulation;

an identifier for identifying:
 the interval of non-random modulation in the signal;
 a first interval of random modulation in the signal in predetermined relationship with the interval of non-random modulation; and
 a second interval of random modulation in the signal in predetermined relationship with the interval of non-random modulation;

a monitor for selectively measuring the energy content of the first and second intervals of random modulation, while excluding the interval of non-random modulation; and an averager for averaging the results of those selective measurements.

BRIEF DESCRIPTION OF DRAWINGS

A method and apparatus in accordance with this invention for measuring the spectral energy in the spectrum of the modulated r.f. signal produced by a GSM MS will now be described, by way of example, with reference to the accompanying drawings, in which:

FIG. 3 is a block diagram of a procedure implemented by a digital signal processor forming part of the apparatus of FIG. 2.

BEST MODE FOR CARRYING OUT THE INVENTION, & INDUSTRIAL APPLICABILITY

The invention will be described in the context of measurement of the ORFS of GSM mobile stations, although it is applicable in other circumstances, such as the measurement of ORFS of mobile telephone base stations.

As noted above, the GSM system uses time-division multiple access (TDMA) to enable multiple mobile stations to use a single channel in the portion of r.f. spectrum assigned for mobile telephony. Accordingly the r.f. signal radiated by a GSM MS comprises a sequence of bursts of energy modulated for example using 0.3 Gaussian Minimum Shift Keying (GMSK) (or in the future a form of Phase Shift Keying (PSK)). Ideally the spectrum of each burst would be confined within the defined frequency limits of the relevant channel throughout the duration of the burst, but attaining this ideal would be very difficult, requiring unduly expensive circuitry, especially in view of the effect of switching transients at the beginning and end of the burst. Accordingly, the GSM specification permits the burst spectrum to overlap the frequency band of adjacent channels, provided the spectral energy in those adjacent channels remains below specified limits. It is therefore important that during manufacture of an MS it is tested for conformance with those limits, to avoid interference with other equipment in the system.

Figure 1:
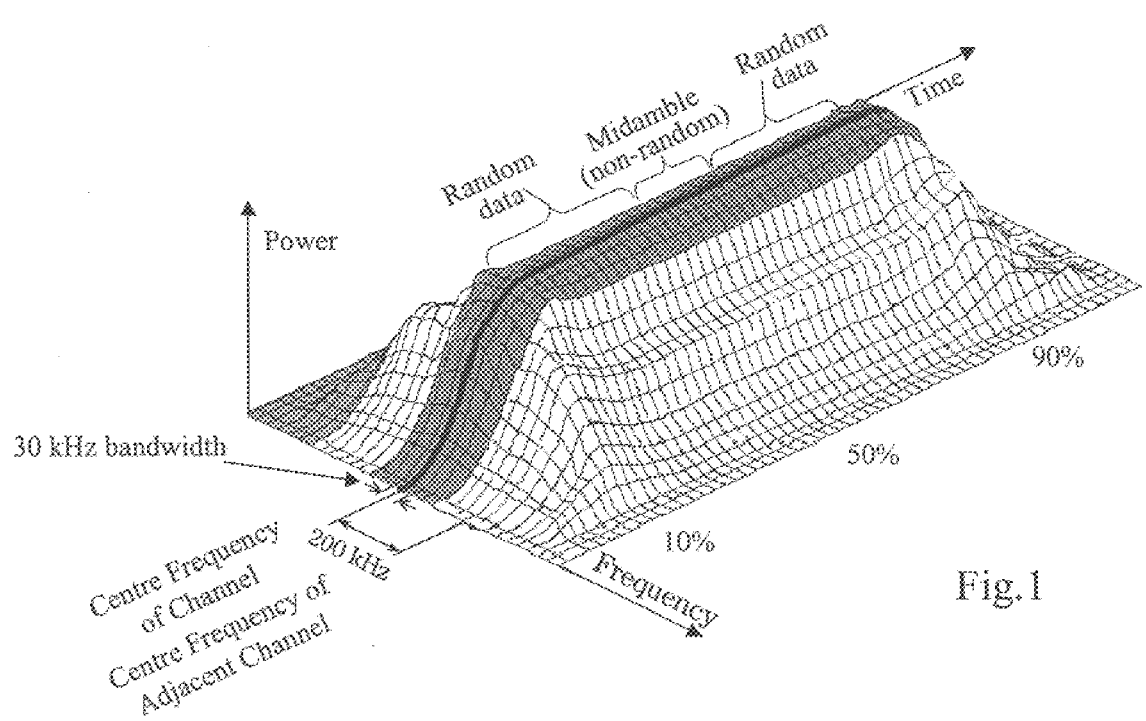
FIG. 1 is a graph illustrating in general terms the distribution of energy in a GSM signal burst as a function of frequency and time.

FIG. 1 illustrates the general form of the distribution of energy in the spectrum of a signal burst from a GSM MS, as a function of time elapsed during the burst. Channels are currently spaced 200 kHz apart, in one of the ranges 876–960 MHz and 1710–1990 MHz, depending on the particular system in use. A single burst contains 148 bits, numbered 0 to 147, each 3.69 microseconds in duration. Referring to FIG. 1, at the start of a burst there is a rapid increase in energy in the burst's spectrum, centred on the centre frequency of the channel but spreading into adjacent channels; a first energy peak (both in terms of power level at the centre frequency and spread of power into adjacent channels), associated with the turn-on switching transient, occurs when approximately 3% of the duration of the burst has elapsed. The spectrum remains free of switching transients from 10% elapsed time to 90% elapsed time, at which point there is another peak, associated with the commencement of the turn-off switching transient, during a rapid decrease to the termination of the burst.

The relevant part of the burst for measurement of ORFS due to modulation extends approximately from the 10% elapsed time to the 90% elapsed time, i.e. from bit 15 to bit 132. However the central part of the burst, the midamble, extending from bits 61 to 86 inclusive, contains fixed data used for synchronising the GSM network, and must be excluded from measurements of ORFS due to modulation.

Figure 2:
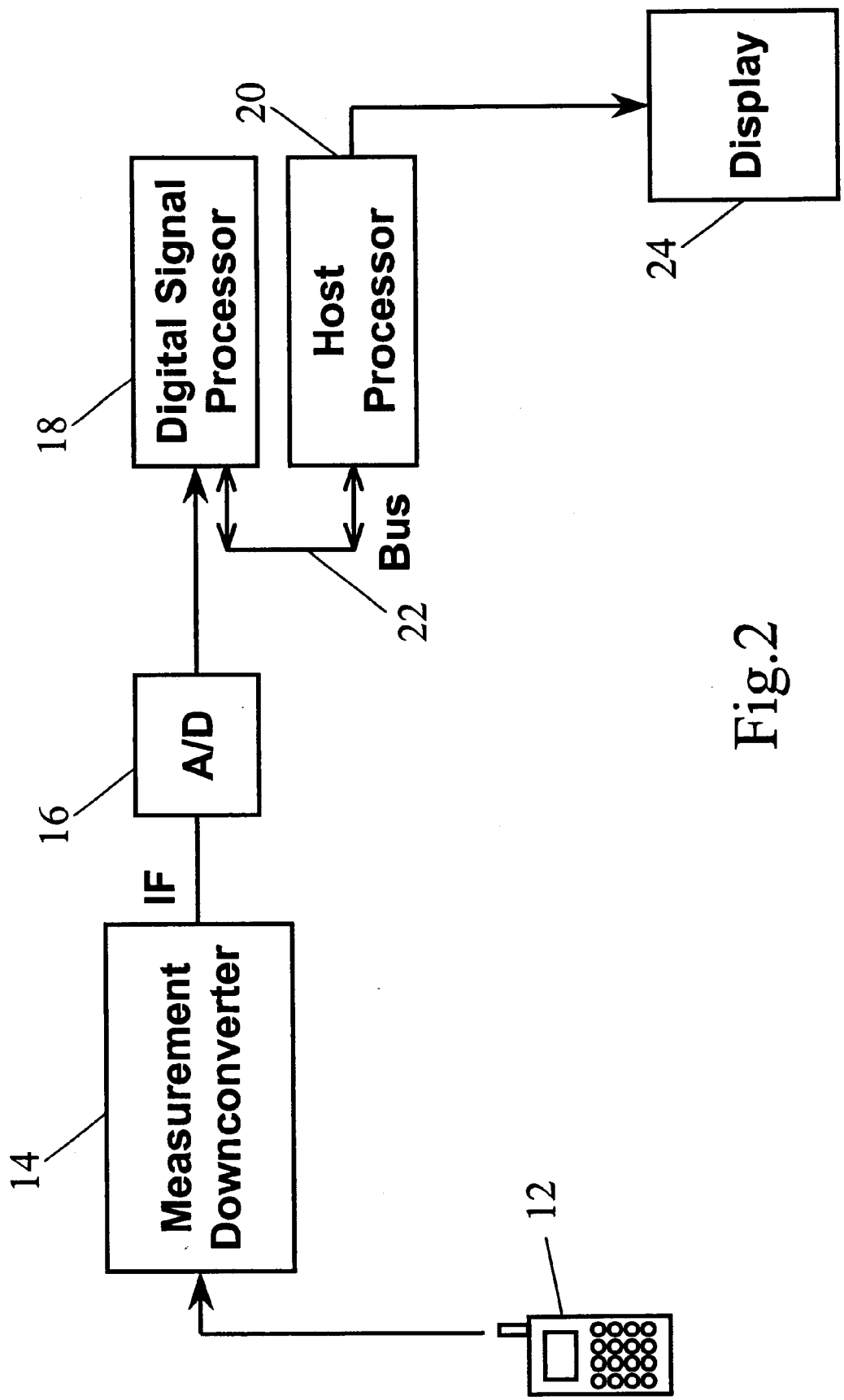
FIG. 2 is a schematic block diagram of apparatus for measuring the spectral energy within such a burst.

FIG. 2 shows a schematic block diagram of apparatus for measuring the spectral energy distribution within a burst such as that shown in FIG. 1. In general terms, the apparatus performs measurements at the centre frequency of the signal in order to establish a reference, and at various frequency offsets on either side of that frequency, relative to that reference. Specifically the signal is passed through a five-pole synchronously-tuned filter with a 3 dB bandwidth of 30 kHz, centred on the required measurement frequency. Then the energy level at that frequency and within that bandwidth of the two useful intervals of the signal burst carrying random data, before and after the midamble, is measured in the time domain. The measurement is restricted to these useful intervals by time-gating the supply of the signal to the input of the energy measuring process. This time-gating may be based upon recognition of and synchronisation with the fixed midamble data pattern, or upon recognition of the overall burst shape and duration. To ensure adequate statistical significance of the measurement, it is repeated at a given setting of the measurement centre frequency for 25 or 100 signal bursts, and the average value of the 50 or 200 measurements is taken as the result for that frequency. Then the entire sequence of 25 or 100 measurements is repeated for each of the remaining required settings of the measurement centre frequency.

Referring to FIG. 2, an MS 12 under test has its antenna coupled to the input of a measurement downconverter 14 which contains a five-pole, synchronously-tuned i.f. filter with a 3 dB bandwidth of 30 kHz. This downconverter 14 downconverts the r.f. signal from the MS 12 to an intermediate frequency which is more convenient for measurement purposes and which can be adjusted to place the desired measurement frequency at the centre frequency of the 30 kHz filter. It should be noted that the settling time of a five-pole, synchronously-tuned i.f. filter following occurrence of the rising edge of a burst is such that its response has settled to less than 0.1 dB error by bit number 15. Therefore the accuracy of the measurement of the first part of the burst is not degraded relative to the accuracy of the measurement of the second part of the burst, when the filter has had longer to stabilise.

The output signal from the downconverter 14 is supplied to an analogue-to-digital (A/D) converter 16, the digital output of which is fed to a digital signal processor (DSP) 18 where the remaining measurement processing is carried out in the digital domain under the control of programmed instructions for the DSP. The results of this processing are supplied to a host processor 20 via a bus 22, and the host processor 20 provides these results (i.e. the ORFS measurement) to output devices such as a display 24.

FIG. 3 shows the steps performed by the DSP 18. At a step 40 the DSP demodulates and scans the samples of a first received burst, and identifies the section of digitised signal corresponding to the midamble by reference to the fixed data pattern with which it is modulated. With this information and the known durations of the midamble and the overall signal burst, the DSP sets a time-gate, at step 42, to select samples representing at least forty of the bits before and after the midamble in each burst, in the sections from bit positions 15 to 60 and 87 to 132 respectively. Using this time-gate the DSP then scans the samples for each burst at step 44, determining the energy represented by the samples corresponding to those sections. This energy determination may be performed by taking the voltage represented by each signal sample and deriving the energy corresponding to application of that voltage to a standard 50 ohm impedance. Finally, at step 46, the spectral energy measurements for the 100 bursts are averaged to derive the required result for the specific 30 kHz wide band in question, expressed in dB relative to the measurement in a 30 kHz bandwidth at the channel centre frequency.

Because the measurement aggregates data from the signal burst sections occurring both before and after the midamble, the statistical significance of the measurement is the same as that derived solely from the sections after the midamble of 200 such bursts.

However, by requiring only 100 bursts the measurement can be accomplished in approximately half the time necessary when 200 bursts are needed. Bearing in mind that the measurement is typically performed for a total of 22 different frequencies in order to characterise the ORFS of an MS, this reduction in time taken enables such a measurement of ORFS due to modulation to be accomplished in approximately 11 seconds, as compared to approximately 22 seconds if only the second of the random data sections of 200 signal bursts are used.

Various modifications of the technique as described above are possible. For example, instead of controlling the time gating by identifying the fixed data pattern of the midamble, the overall expected time envelope and duration of the filtered burst can be compared with the signal samples, to identify the signal samples which correspond to the random and non-random intervals in the burst. Although the use of the DSP 18 enables the system to be implemented in a convenient and flexible manner, it is also possible to use hardware circuitry designed to perform the required specific tasks.

Instead of using an analogue 30 kHz filter followed by a-d conversion, it is possible to sample the i.f. signal directly over a much wider bandwidth, and then apply a 30 kHz filter in the digital domain. This filter can then be centred at various frequencies in the sampled signal, thus allowing the ORFS due to modulation to be measured for several frequency offsets from the carrier using data from one sampled burst. To attain the full benefit of the present invention in these circumstances an appropriately fast digital signal processor is required.

What is claimed is:

1. A method of measuring the spectral energy within a measurement bandwidth in the spectrum of a modulated signal which has a modulation bandwidth exceeding said measurement bandwidth and which contains at least two intervals of random modulation to be included in the measurement and an interval of non-random modulation to be omitted from the measurement, comprising the steps of:

receiving a signal containing the intervals of random and non-random modulation;

identifying the interval of non-random modulation in the signal;

identifying a first interval of random modulation in the signal in predetermined relationship with the interval of non-random modulation;

identifying a second interval of random modulation in the signal in predetermined relationship with the interval of non-random modulation;

selectively measuring the energy content of the first and second intervals of random modulation, while excluding the interval of non-random modulation; and averaging the results of those selective measurements.

2. The method of claim 1, wherein the signal is a burst modulated signal.

3. The method of claim 1, wherein the signal's modulation is 0.3 GMSK or PSK.

4. The method of claim 1, wherein successive signals are received and selective measurements of the energy content of first and second intervals of random modulation are made for each such successive signal.

5. The method of claim 4, wherein the selected measurements are made for twenty-five signals, to measure fifty intervals of random modulation.

6. The method of claim 4, wherein the selected measurements are made for one hundred signals, to measure two hundred intervals of random modulation.

7. The method of claim 1, wherein the measurements are performed by setting two time-gates to select the first and second intervals of random modulation from the signal.

8. Apparatus for measuring the spectral energy within a measurement bandwidth in the spectrum of a modulated signal which has a modulation bandwidth exceeding said measurement bandwidth and which contains at least two intervals of random modulation to be included in the measurement and an interval of non-random modulation to be omitted from the measurement, comprising:

a receiver for receiving a signal containing the intervals of random and non-random modulation;

an identifier for identifying:
the interval of non-random modulation in the signal;
a first interval of random modulation in the signal in predetermined relationship with the interval of non-random modulation; and
a second interval of random modulation in the signal in predetermined relationship with the interval of non-random modulation;

a monitor for selectively measuring the energy content of the first and second intervals of random modulation, while excluding the interval of non-random modulation; and an averager for averaging the results of those selective measurements.

9. The apparatus of claim 8, including a timer for setting to time-gates to select the first and second intervals of random modulation from the signal.

* * * * *

UNITED STATES PATENT AND TRADEMARK OFFICE
CERTIFICATE OF CORRECTION

PATENT NO.    : 6,424,932 B1
DATED         : July 23, 2002
INVENTOR(S)   : Moray Denham Rumney It is certified that error appears in the above-identified patent and that said Letters Patent is hereby corrected as shown below:

Column 6,
Line 2, change "to time-gates" to -- two time-gates --

Signed and Sealed this

Fourth Day of March, 2003

JAMES E. ROGAN
*Director of the United States Patent and Trademark Office*